(12) United States Patent
Obata (10) Patent No.: US 7,729,872 B2
(45) Date of Patent: Jun. 1, 2010

(54) DIGITAL SIGNAL ANALYSIS PROGRAM AND WAVEFORM DISPLAY APPARATUS

(75) Inventor: Toshiaki Obata, Yokohama (JP)

(73) Assignee: Tektronix, Inc., Beaverton, OR (US)

( * ) Notice: Subject to any disclaimer, the term of this patent is extended or adjusted under 35 U.S.C. 154(b) by 299 days.

(21) Appl. No.: 11/689,994

(22) Filed: Mar. 22, 2007

(65) Prior Publication Data

US 2007/0223569 A1 Sep. 27, 2007

(30) Foreign Application Priority Data

Mar. 23, 2006 (JP) ............................. 2006-081289
May 18, 2006 (JP) ............................. 2006-138723

(51) Int. Cl.
*G01R 13/00* (2006.01)
*G06F 17/40* (2006.01)

(52) U.S. Cl. ............................. 702/67; 702/66; 702/69; 375/226

(58) Field of Classification Search .................. 702/67, 702/66, 69
See application file for complete search history.

(56) References Cited

U.S. PATENT DOCUMENTS

| 6,806,877 | B2 | 10/2004 | Fernando | |
|---|---|---|---|---|
| 6,810,346 | B2* | 10/2004 | Nygaard et al. | 702/117 |
| 6,934,647 | B2* | 8/2005 | MacDonald | 702/66 |
| 2004/0153266 | A1* | 8/2004 | Nygaard, Jr. | 702/68 |
| 2006/0182205 | A1* | 8/2006 | Draving et al. | 375/346 |

* cited by examiner

*Primary Examiner*—Hal D Wachsman
(74) *Attorney, Agent, or Firm*—Thomas F. Lenihan (57) ABSTRACT

Selectable portions of a display on a display screen allow a user to select bits of a digital signal. A mode selection menu changes the bit selection to select bits in different ways. If an individual bit designation mode is selected, objects are displayed that correspond to the respective bits of the digital signal. A user selects the object corresponding to a desired bit by use of a mouse. After bit selection, an eye pattern, derived from only selected bits, is displayed. Additionally, jitter analysis results derived from only the selected bits are displayed.

17 Claims, 8 Drawing Sheets

PULL-DOWN EXAMPLE OF MENU 54

Fig. 8B

BIT PATTERN SEARCH : 10111 — 88

FIG. 11

```
START BIT SEL PATTERN  : 1111100000000000     ⌐80
END BIT SEL PATTERN    : 0000000000011111
SHIFT BIT NUMBER: 1
```

Fig. 9A

```
      BIT SEL PATTERN           ⌐82
 1ST : 1111100000000000
 2ND : 0111110000000000
 3RD : 0011111000000000
 4TH : 0001111100000000
 5TH : 0000111110000000
 6TH : 0000011111000000
 7TH : 0000001111100000
 8TH : 0000000111110000
 9TH : 0000000011111000
10TH : 0000000001111100
11TH : 0000000000111110
12TH : 0000000000011111
```

Fig. 9B

```
START BIT SEL PATTERN  : 1111100000000000     ⌐84
END BIT SEL PATTERN    : 0000000000011111
SHIFT BIT NUMBER: 5
```

Fig. 10A

```
      BIT SEL PATTERN           ⌐86
 1ST : 1111100000000000
 2ND : 0000011111000000
 3RD : 0000000000111110
```

FIG. 13

DIGITAL SIGNAL ANALYSIS PROGRAM AND WAVEFORM DISPLAY APPARATUS

CLAIM FOR PRIORITY

The subject application claims priority under 35 U.S.C. 119 from Japanese patent application 2006-81289, entitled WAVEFORM DISPLAY APPARATUS AND PROGRAM FOR EYE PATTERN DISPLAY, (Obata), filed 23 Mar. 2006, and from Japanese patent application 2006-138723, entitled, DIGITAL SIGNAL ANALYSIS PROGRAM AND WAVEFORM DISPLAY APPARATUS, (Obata), filed 18 May 2006, both of which are assigned to the same assignee as the subject application.

FIELD OF THE INVENTION

In general, the present invention relates to a method and apparatus for measuring the quality of a digital signal, and specifically concerns a method and apparatus for displaying jitter analysis results or an eye diagram.

BACKGROUND OF THE INVENTION

Figure 1:
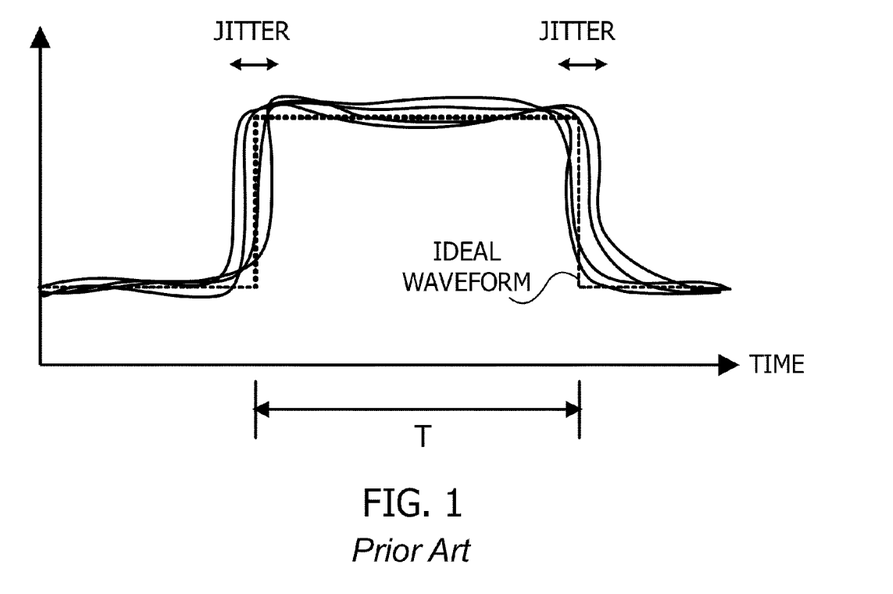
FIG. 1 is a graph showing examples of digital signals using rectangular pulse signals, as known from the prior art.

A digital signal is a modified signal based on "1" and "0" data to be transferred and may be a square wave signal for example. FIG. 1 is an example of one bit of a digital signal using a square wave (i.e., a rectangular pulse) signal, as known from the prior art. If a propagation path between sender and receiver circuits is ideal, then the waveform of the square wave signal does not change after propagation and exhibits an ideal waveform shape, shown as a dotted line. The digital signal that is sent represents data of one or more bits depending upon which particular modulation method was used to determine its symbol interval. The receiver demodulates "1" and "0" data by detecting values (i.e., levels) of the square wave signal at every symbol interval T.

An actual transferred digital signal usually has distortions relative to the ideal waveform depending upon characteristics of the propagation path or the rate of the signal. That is, although the information that the digital signal transfers is digital data of "1's" and "0's", the signal itself is an analog signal. Therefore, a waveform display apparatus (e.g., a test and measurement instrument), such as a digital oscilloscope, real time spectrum analyzer, logic analyzer, or the like, that can sample and store an input signal as digital waveform data is used to display an eye pattern or measure characteristics of jitter exhibited by the input signal.

Figure 2:
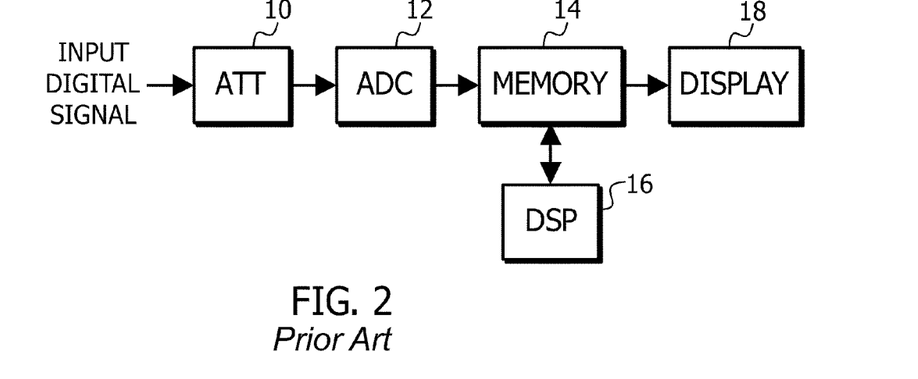
FIG. 2 is a functional block diagram of an example of a waveform display apparatus as known from the prior art.

FIG. 2 is a functional block diagram of an example of a waveform display apparatus, such as a digital oscilloscope, as known from the prior art. A digital signal as a signal under test is provided to a pre-amplifier ATT 10 to adjust the amplitude properly. An analog to digital converter ADC 12 samples the digital signal at an interval that is sufficiently shorter than the symbol interval T to convert the digital signal into digital data in the time domain. A plot of the digital data along a time axis provides a waveform display. The digital data is stored in a memory 14 and then a DSP (digital signal processor) 16 develops the digital data into image data suitable for display of eye patterns described below. The image data are read from memory 14 and displayed as waveforms on a display 18 having a display screen such as a LCD. The DSP 16 also produces spectrum data, necessary for jitter analysis, by FFT calculations performed on the time domain digital data.

A CPU (not shown) controls the waveform display apparatus and a user can enter necessary settings into the waveform display apparatus via an operation panel or mouse. OS (operation software) that is also used in a PC is installed into a large memory storage means, such as an HDD (i.e., hard drive). Many kinds of application software are installed on the OS and opened as software windows to execute various functions. Memory 14 may be realized by RAM or the HDD.

Figure 3:
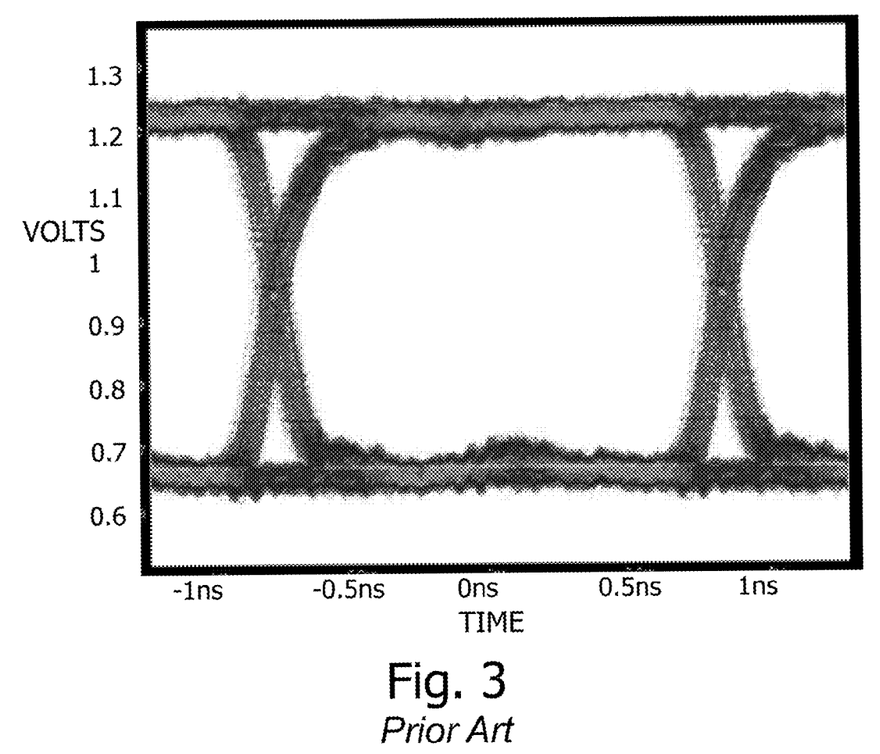
FIG. 3 is an example of displaying an eye pattern of a digital signal using a waveform display apparatus, as known from the prior art.

FIG. 3 is an example of displaying an eye pattern of the digital signal using the waveform display apparatus, as known from the prior art. In this case, the digital signal may be a 32-bit signal transferred as packets and the eye pattern is a repetitive overlaid display of waveforms of the bits. In the eye pattern display, larger distortion in the waveforms leads to a displayed eye area that is smaller than normal or the eye diagram may exhibit a larger difference in shape from the ideal shape. Therefore, shape or area of the eye are measured to measure quality of the digital signal. U.S. Pat. No. 6,806,877 discloses such an invention, for example.

Eye pattern presentations typically show frequency of signal occurrences as a histogram using, for example, seven colors of the spectrum. That is, a color which is closer to red means a higher frequency of occurrences of the signal at a given pixel and a color closer to violet means a lower frequency of occurrences of the signal at a given pixel. The eye diagram is also called an eye pattern.

Figure 4:
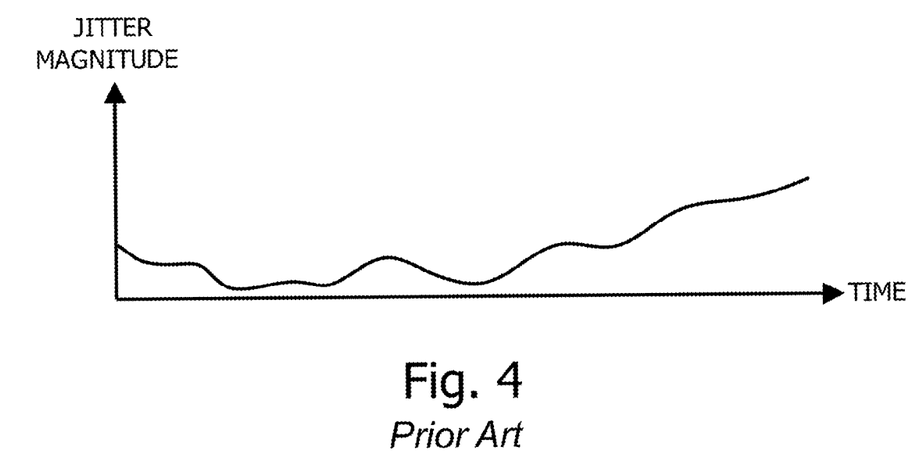
FIG. 4 is a time trend display of a jitter analysis result, as known from the prior art.
Figure 5:
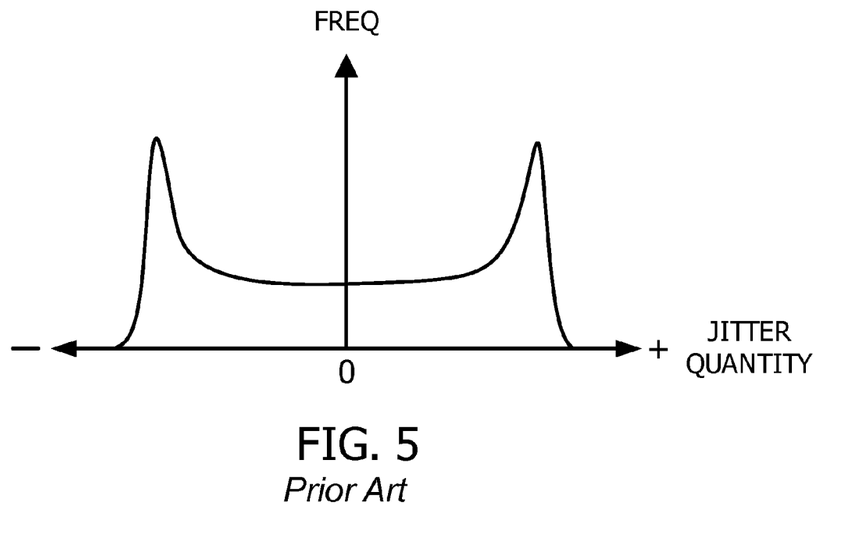
FIG. 5 is a histogram display of a jitter analysis result display, as known from the prior art.

When measuring the quality of a digital signal, the jitter of rising and falling edges is often analyzed and the results displayed as well-know graphs, in addition to displaying an eye pattern. For example, FIG. 4 is a time trend display of jitter, having time as the horizontal axis and jitter magnitude as the vertical axis, as known from the prior art. A time trend display shows how the magnitude of the jitter changes according to time variation. FIG. 5 is a histogram showing jitter frequency, as known from the prior art. The horizontal axis is divided into "bins", wherein each "bin" represents a deviation in time (either plus or minus) from a center location of zero deviation. The vertical axis indicates the frequency of occurrences (i.e., hits) in any one bin. If the jitter is caused by heat in the device under test, then the histogram draws a Gaussian curve that has the peak around jitter quantity zero. But if the jitter is dependent upon patterns of 0's and 1's it can be a histogram as shown in FIG. 5. In addition, such DSP capability provides statistical data for jitter frequency analysis, such as jitter spectrum and Max/Min numeric values, as graphs or numeric values.

In a conventional eye pattern of a waveform comprising 32 bits, a waveform for each of the 32 bits is drawn (i.e., displayed) such that all 32 waveforms are overlaid. Currently, there is no way to display only those eye pattern or a graph of jitter analysis results that reflect specific bits that may be of interest to a user.

What is desired is a waveform display apparatus and method that can display eye pattern or jitter analysis results relating to specific selected portions of a waveform.

SUMMARY OF THE INVENTION

An apparatus and method for analyzing a digital signal under test uses data that is obtained by sampling the digital signal. A bit selection function allows a user to select arbitrary bits of the digital signal and select a function for displaying signal characteristics of the selected bits wherein the signal characteristics are displayed as an eye pattern or jitter analysis results. Further, when the waveforms of the digital signal are displayed, the waveform display apparatus can be controlled to execute a function to display waveforms of the arbitrary bits such that they can be distinguished from the waveforms of the other bits. In addition, the waveform display apparatus can be controlled to execute a waveform selection function to make the displayed distinguished waveforms selectable, and to execute a function for displaying only the selected waveforms.

DETAILED DESCRIPTION OF THE EMBODIMENTS

In a conventional eye pattern of a waveform comprising 32 bits, a waveform for each of the 32 bits is drawn (i.e., displayed) such that all 32 waveforms are overlaid. However, it is herein recognized that it would be useful to display an eye diagram or a graph of jitter analysis results reflecting only specific bits that are of interest to a user. For example, when signal transition is especially of interest to a user, it would be efficient to display an eye diagram that includes only those bit patterns exhibiting transitions from 0 to 1 or from 1 to 0, such as 010 and 101. In another example, where a digital signal has 32 bits and the 24th through 30th bits have specific information of particular interest to a user, apparatus according to an embodiment of the subject invention provides for an efficient measurement by displaying an eye diagram that includes only these bits. Similarly, another embodiment of the subject invention provides for an efficient measurement by displaying jitter analysis results as graphs, etc. wherein the jitter analysis results are derived from only the specific bits that the user desires.

The bit selection function of the subject invention can be realized in several different embodiments. A first method is to provide selectable predetermined bit patterns. A second method is to designate an arbitrary bit number for selected or non-selected sequential bits in the digital signal. A third method is to designate any bit of the digital signal individually. A fourth method is to designate an arbitrary bit selection pattern and the number of shift bits, and sequentially change selected bits in the digital signal according to the shift bit number. A fifth method is to designate an arbitrary bit pattern in the bit selection function to search bit patterns corresponding to the designated bit pattern to select bits included in these patterns (i.e., pattern search). Further, the digital signal can be displayed as waveforms that can be easily distinguished by colors, line patterns, etc., and then designated with a mouse cursor to select waveforms for selecting desired bits.

From another point of view, the present invention relates to a waveform display apparatus to display jitter analysis results, or an eye diagram, of arbitrary bits of a digital signal. This waveform display apparatus includes bit selection means for selecting desired bits of the digital signal and a display means for displaying jitter analysis results or an eye pattern of the selected bits of the digital signal. The bit selection means may be provided as hardware as a part of an operation panel, or as displayed objects on a display screen to enter settings with the operation panel or a mouse. In one embodiment, a user operates the bit selection means to designate any, or all, of the bits of the digital signal, or is operated by the user to choose one of a plurality of predetermined selectable bit patterns. In addition, the waveforms can be displayed with different colors, patterns, etc. to be able to easily distinguish them for selection by use of a mouse cursor for selecting desired bits.

All embodiments of the present invention can display an eye diagram or a graph of jitter analysis results using only bits of interest to the user in order to provide efficient observation and measurement with regard to the condition of the digital signal.

One embodiment of the present invention can be realized by installing a program that adds functions into a conventional waveform display apparatus as described with respect to FIG. 2. The waveform display apparatus may be a digital oscilloscope as described above, for example. The program installs operation software similar to that used in a PC and provides GUI (Graphical User Interface) based operation using mouse, etc. The operation software can also open a plurality of windows that display different graphs respectively.

Figure 6:
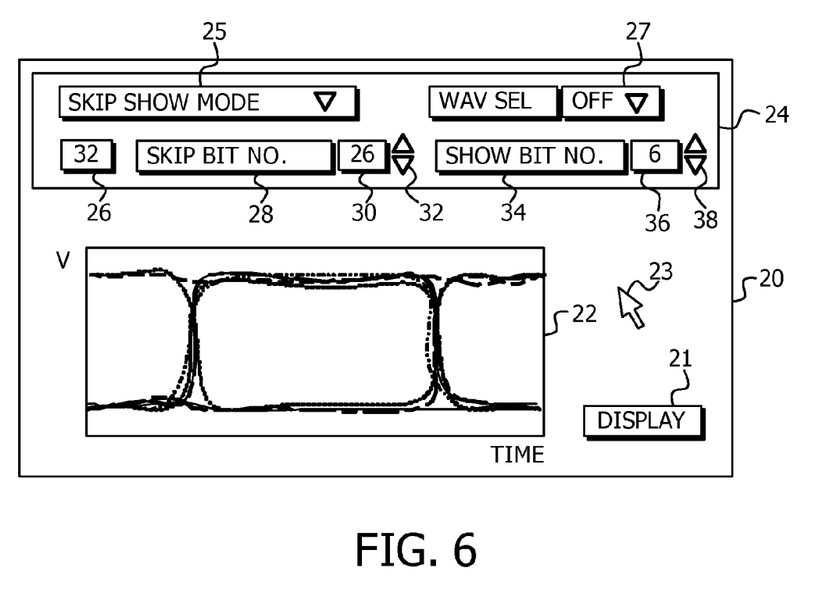
FIG. 6 is an example of displaying an eye pattern in a Skip and Show mode according to the present invention.
Figure 7:
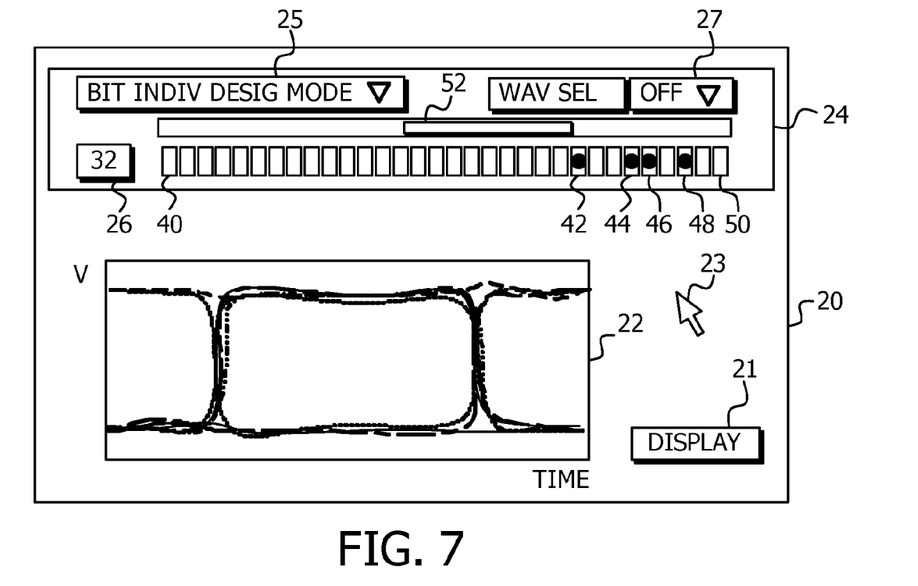
FIG. 7 is an example of displaying an eye pattern in an individual bit designation mode according to the present invention.
Figure 8A:
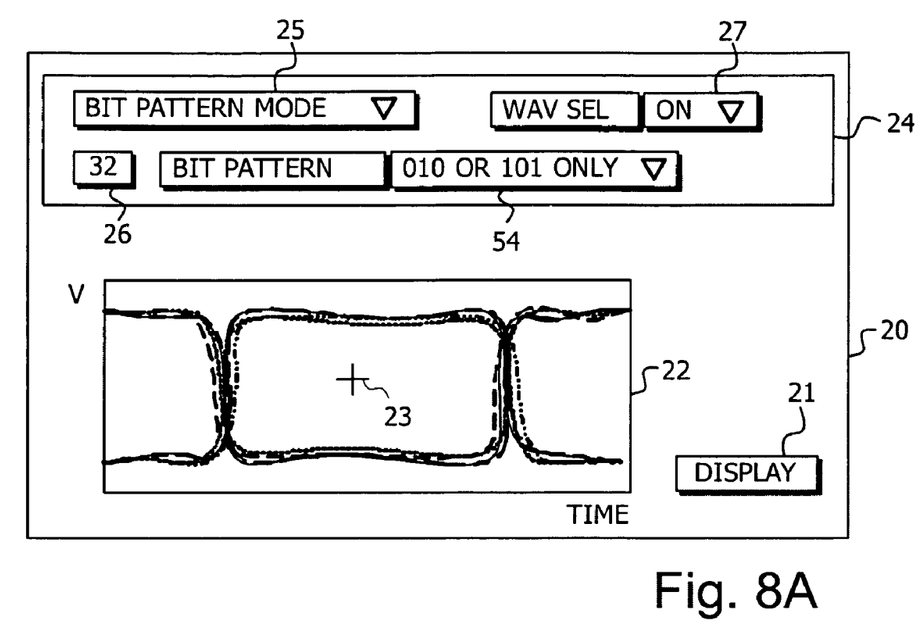
FIGS. 8A and 8B are examples of displaying an eye pattern in a bit pattern mode and a pull down menu therefor, respectively, in accordance with the present invention.
Figure 8B:
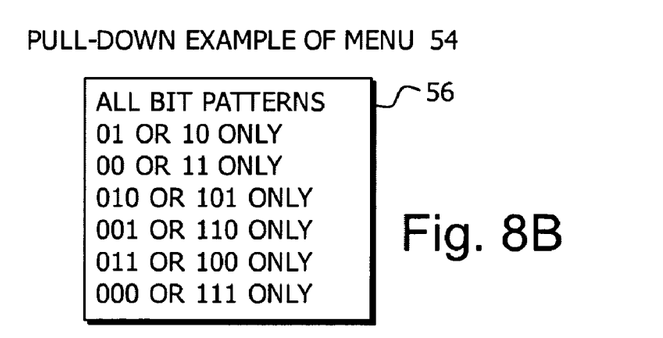

FIG. 6 is an example of a screen display according to the present invention. A waveform display area 22 in a screen 20 of the display apparatus 18 displays an eye pattern. FIGS. 6-8 show waveforms constituting an eye patterns with different line patterns such as solid line, dotted line, dotted line with points, etc. because the FIGURES are monochrome for reproduction in patent office publications. However, one skilled in the art will recognize that the actual eye patterns displayed on a modern instrument would preferably be displayed in a variety of colors. For simplicity of explanation of the FIGURES, the examples shown have considerably fewer waveforms than would be used in an actual average case.

In place of the eye diagram display, or while displaying an eye diagram, another window displays a jitter analysis result as a graph or numeric values. The graph itself can be time trend, spectrum, histogram, Max/Min, etc. similar to the conventional ones. However, the graphs of the subject invention are different from conventional graphs in that the displayed jitter analysis results concern only selected desired bits according to user settings.

When the digital signal analysis program according to an embodiment of the present invention is installed and executed in the waveform display apparatus, the display screen 20 displays a bit selection area 24 that has a plurality of objects, described below. Referring again to FIG. 6, when the user clicks a triangle object at the right side of a bit selection mode menu tab 25 by use of a mouse 23, a bit selection mode menu provides a pull-down menu style. The selectable modes can be, but are not limited to, "Skip and Show mode off", "Skip and Show", "Show and Skip", "Bit Individual Designation", "Bit Pattern", "Bit Selection Pattern Shift" and "Bit Pattern Search", for example.

In the "Skip and Show mode off" mode of operation all bits are selected, this mode being used when it is desired to conduct a conventional measurement. FIG. 6 shows a display example of the "Skip and Show" mode, in which a user can designate how many of the lower bits of a packet are to be skipped (i.e., not selected), thereby selecting only the remaining upper bits for display in an eye diagram of the waveform. Conversely, in "Show and Skip" mode a user can designate how many of the lower bits of a packet are to be selected for display in an eye diagram, thereby skipping the remaining upper bits.

A total bit number display field 26 displays the total number of bits of a packet of an input digital signal, in this example, 32 bits. The digital signal may be input as packets and the CPU or DSP analyzes the packets to obtain the information of the bit number. A lower bit skip/show field 28 indicates whether the lower bits are set to skip or to show. A skip/show lower bit number designation field 30 is used by user to designate the number of lower bits to skip or show, as explained above. The user may change the numeric value of the field 30 by use of an operation panel, or by clicking up/down arrows 32 with a mouse cursor 23 to change the numeric value. Similarly, an upper bit skip/show field 34 indicates that the upper bits are set to skip or show. A skip/show upper bit number designation field 36 is used by the user to designate the number of upper bits to skip or show. The user can change the numeric value of field 36 by use of an operation panel or mouse cursor 23. The bit number designation fields 30 and 36 are controlled to cooperate, so that when the user changes one of them, the other is automatically changed to make the total bit number (i.e., the sum of the numeric values of fields 30 and 36) equal to the numeric value indicated in the total bit number display field 26. Similarly, in the Show and Skip mode, field 28 indicates "Show bit number" (i.e., the number of bits selected to be shown) and field 34 indicates "Skip bit number" (i.e., the number of bits selected to be skipped).

Additional applications of the "Skip and Show" mode, such as "Arbitrary Designated Skip and Show" mode and "Arbitrary Designated Show and Skip" mode are provided. By use of these modes, a user can designate sets of skip and show bit numbers of which respective bit numbers are arbitrarily and independently designated. For example, letters and numbers may be input via on-screen controls to designate bits in the following pattern, first skip: 3 bits, first show: 4 bits, second skip: 6 bits, second show: 8 bits, third skip 7 bits and third show 5 bits. In place of a Skip and Show order, a Show and Skip order may be designated, in similar fashion. The three sets of Skip and Show orders described above are an example of arbitrary selection of the number of bits in any given set.

FIG. 7 shows an example wherein the Bit Individual Designation mode is selected. Objects in FIG. 7 corresponding to those of FIG. 6 are described by use of the same reference numerals. When the Bit Individual Designation mode is selected by use of mode selection menu 25, box objects corresponding to the respective bits of a digital signal are displayed. In the example of FIG. 7, a box 40 corresponds to the least significant bit (LSB) (first bit), a box 50 corresponds to the most significant bit (MSB) (32nd bit), and middle boxes from left to right correspond sequentially to bits having greater respective significance. In operation, a user clicks some or all of the box objects with mouse cursor 23 to designate bits to be used for the digital signal analysis. In FIG. 7, black circles are shown in the centers of box 42 for 24th bit, box 44 for 27th bit, box 46 for 28th bit, and box 48 for 30th bit to indicate that they have been selected. In this case, an eye diagram display is derived from only the respective 24th, 27th, 28th and 30th bits of each packet received from a digital signal including multiple packets. Similarly, jitter analysis results are displayed as graphs or text and numbers using statistical data derived from only the 24th, 27th, 28th and 30th bits of each packet.

If the number of bits is too large for all of the corresponding box objects to be displayed simultaneously on the display screen, a slider 52 may be additionally displayed to allow the user to slide the box objects to the right and left by sliding slider 52 using mouse cursor 23, so as to be able to access and designate any of the bits. In a further embodiment, when mouse cursor 23 is positioned close to one of the box objects, a text message of "XXth bit" is displayed for a given time to confirm with text exactly which bit that particular box corresponds to.

FIG. 8A shows an example of a case in which the Bit Pattern mode of operation is selected. Objects in FIG. 8A corresponding to those of FIG. 6 are designated by the same reference numerals. In this mode of operation, bit patterns that are relatively frequently used for measurement are pre-installed in a bit pattern pull down menu 54, in advance. The user may select a desired bit pattern from the bit patterns appearing in menu 54 by clicking a triangle object at the right side of Bit Pattern Mode tab 25 of FIG. 8A, using mouse cursor 23 to obtain an eye diagram display derived from only those bits of the digital signal that correspond to the selected bit pattern. The pre-installed menu items of menu 54 can have predetermined patterns such as, "01 or 10 only", "01 or 10 only", "00 or 11 only", "010 or 101 only", "001 or 110 only", "011 or 100 only" and "000 or 111 only", and additionally "All bit patterns", as shown in pull down menu 56 of FIG. 8B. Selecting "All bit patterns" causes a display of jitter analysis results or an eye diagram derived from all bits, this selection being used when it is desired to produce displays similar to conventional displays.

The bit patterns such as "01 or 10 only" or "010 or 101 only" include transitions from 0 to 1 or 1 to 0 so that they are suitable for observing or measuring the digital signal by focusing on the transitions. This selection is effective for jitter analysis since it includes rising or falling edges. On the other hand, the patterns of only "0" or "1" such as "000 or 111 only" have no transitions, thereby making it effective for observing or measuring whether an abnormal transition has occurred. The jitter analysis may not be conducted for this selection since there would be no rising or falling edges.

Figure 9A:
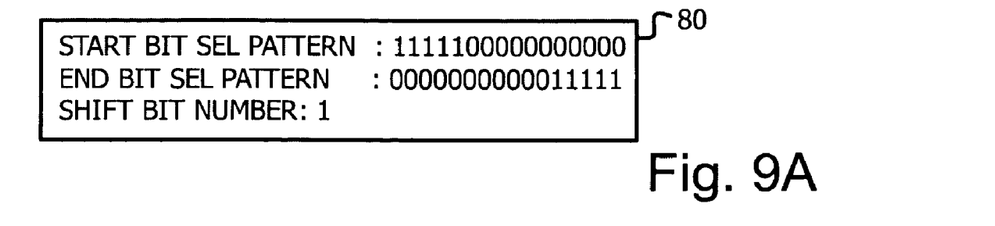
FIGS. 9A and 9B show an example of a bit selection pattern shift mode, and a bit select pattern array, respectively, in accordance with the present invention.
Figure 9B:
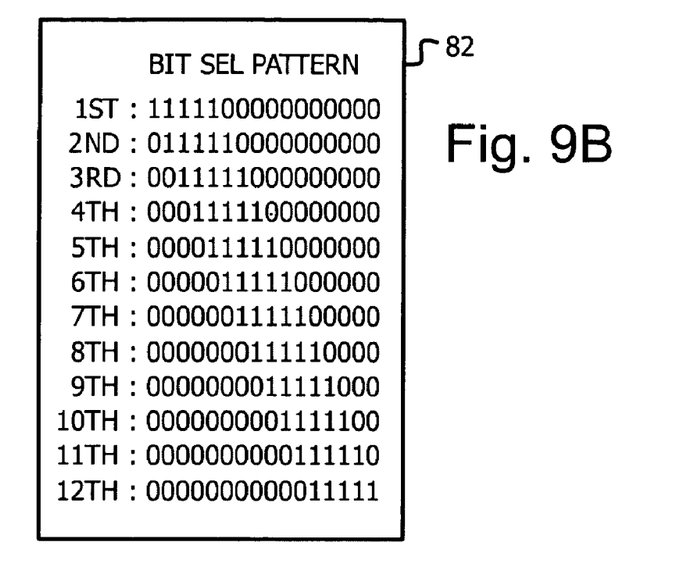

FIG. 9A shows an operational example of a Bit Selection Pattern Shift mode of operation, for a case in which a 16-bit packet of a digital signal is used. Bit Selection Pattern Shift mode sequentially shifts a bit selection pattern according to a user designated shift bit number from a starting "bit selection pattern" through an ending "bit selection pattern", wherein the bit pattern is designated by a user, and collects data for displaying an eye diagram or a graph of jitter analysis results shift by shift. As shown in FIG. 9A, a starting bit selection pattern is a pattern for selecting a first bit (LSB) through a fifth bit sequentially as shown in a frame 80. Note that when the bit selection pattern of FIG. 9B is applied to the digital signal; under test, a value of "1" in the bit selection pattern causes selection of a corresponding bit in each 16-bit packet of the digital signal under test, and a value of "0" means not to select. It is important to note that in this case, the values "1" and "0" in the bit selection pattern do not relate to whether each corresponding bit of the 16-bit packet of the digital signal under test is a logic level "1" or not. That is, a "1" in any given place in the bit selection pattern will cause selection of the corresponding bit in each of the 16-bit packets of the digital signal under test, regardless of whether the corresponding bit in any given packet is a logic level "1" or a logic level "0". The ending "bit selection pattern" is a pattern for selecting a twelfth bit through a sixteenth bit (MSB). The shift bit number is one in this example. These setting values are realized by a user inputting parameters including the desired starting bit selection pattern, etc. via a user interface including frame 80 for designating the bit selection pattern shift parameters displayed in the bit selection means 24 of FIG. 7.

In the example of FIG. 9A, the shift bit number is "one", so that the pattern of bits is shifted right by only one bit position as shown in frame 82 of FIG. 9B. Thus, at the second data collection, the second through sixth bits of each 16-bit packet of the digital signal under measurement are selected for the collection of data to display in an eye diagram or a graph of jitter analysis results. The shift of the bit selection pattern is repeated to collect data until the ending bit selection pattern has been used. The shifted bit selection pattern information shown in frame 82 can be displayed in another window, if necessary.

Figure 10A:
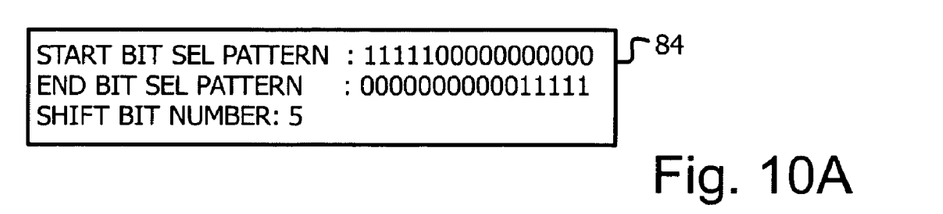
FIGS. 10A and 10B show another example of a bit selection pattern shift mode, and another bit select pattern array, respectively, in accordance with the present invention.
Figure 10B:
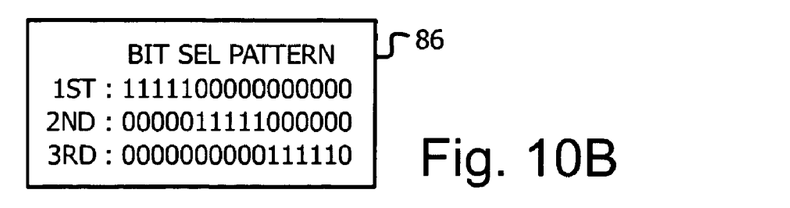

FIGS. 10A and 10B show another operational example of the Bit Selection Pattern Shift mode of operation in which the shift bit number is "five". The starting and ending bit selection patterns are the same as in the example of FIGS. 9A and 9B. In this case, if the fourth shift were conducted, it would provide a bit selection pattern that is shifted more than the ending bit selection pattern. Therefore, the shifting operation is terminated after the third shift.

There are several ways in which the shift processes may be accomplished. One method is not to display intermediate results, but rather automatically conduct the shifts until the end, and thereafter display the respective results as eye diagrams or graphs, etc. of the jitter analysis results according to the user's needs. Another method displays eye diagrams or a graph of jitter analysis results after every shift is finished, wherein they are displayed for a predetermined time before the process automatically advances to the next shift, or until the occurrence of an interactive operation such as, the user pushing a given button to advance the process to the next shift. FIGS. 9A, 9B, 10A, and 10B show examples in which the bit selection pattern is shown as 5-bit sequentially shifts, but other bit selection patterns are available. For example, a bit selection pattern including a non-selecting bit such as "101" can also be shifted.

Figure 11:
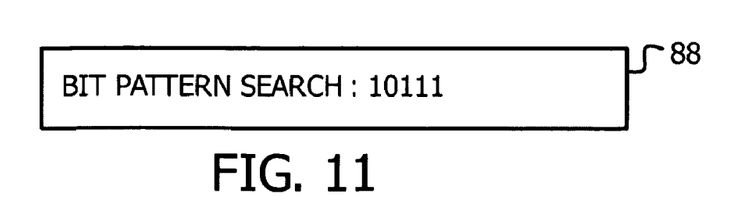
FIG. 11 shows an example of inputting a user-desired bit pattern for searching in a bit pattern search mode according to the present invention.

FIG. 11 shows an example of a bit pattern for searching in the Bit Pattern Search mode of operation. In this mode, the user designates a desired bit pattern, and the waveform display apparatus searches for the designated bit pattern among the bit patterns of the digital signal stored in memory to display an eye diagram or a graph of jitter analysis results derived from only occurrences of matching bit patterns. An object 88 for inputting a search bit pattern is displayed in the bit selection means 24.

Figure 12:
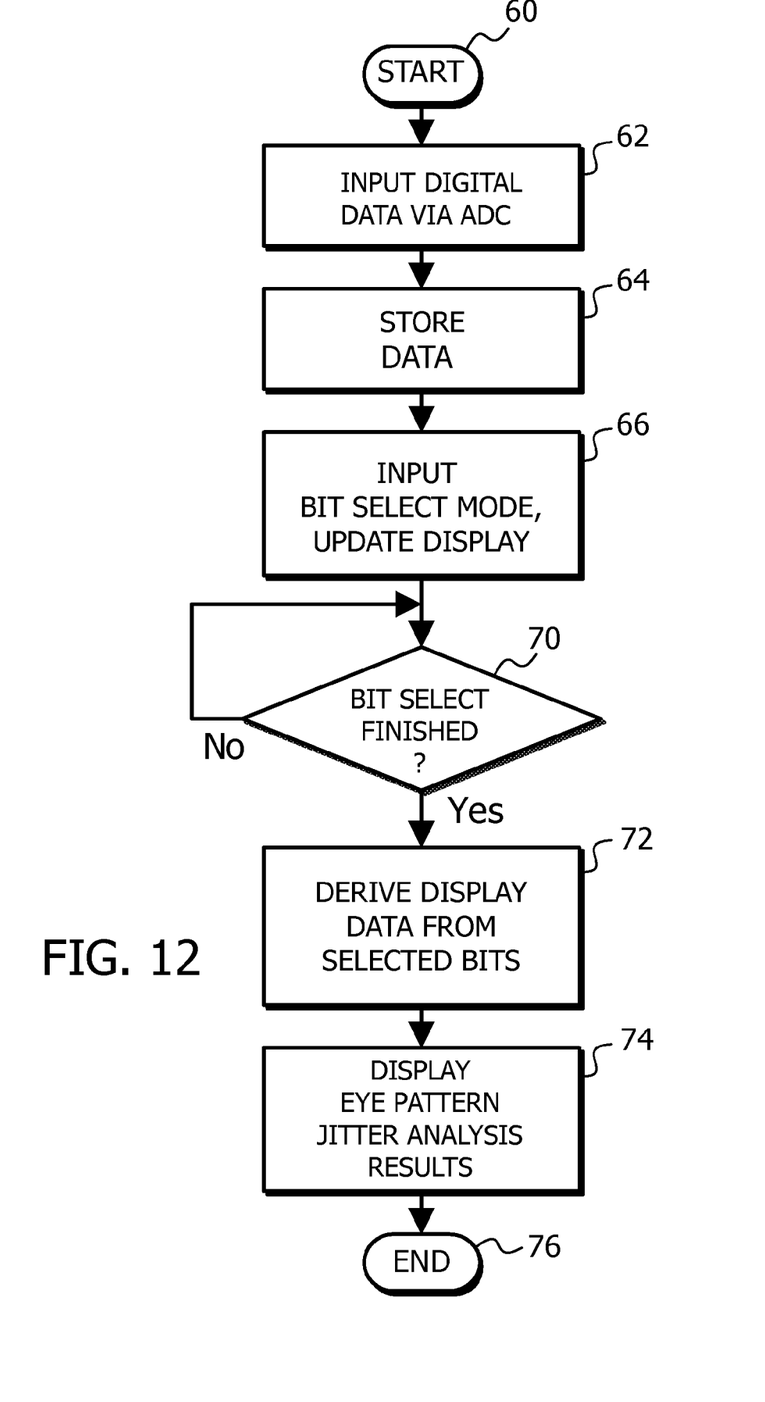
FIG. 12 is an example of a flow chart showing process flow of bit selection and display according to the present invention.

FIG. 12 is a flow chart showing the process flow for displaying an eye diagram or a graph of jitter analysis results, derived from data collections as shown, for example, in FIGS. 6 through 11. An input digital signal is converted by analog to digital conversion (step 62) and the resulting digital data are stored in memory 14 (step 64). A user selects a mode of operation using bit selection means 24, and the display of the bit selection means 24 is changed (step 66). The user pushes a display button 21 by use of mouse cursor 23 after selecting bits with the bit selection means 24, and at step 70 the program takes the YES path and advances to step 72. At step 72, DSP 16 produces data for an eye diagram or a graph of jitter analysis results based only on the selected bits. The data is displayed in waveform display area 22 of display screen 20 via memory 14 as an eye pattern and, in another window, as a graph of jitter analysis results (step 74). The eye diagram and graph of jitter analysis results can be displayed simultaneously, or independently from one another, and can be derived from a digital signal that may have been previously stored, or from currently received data.

Figure 13:
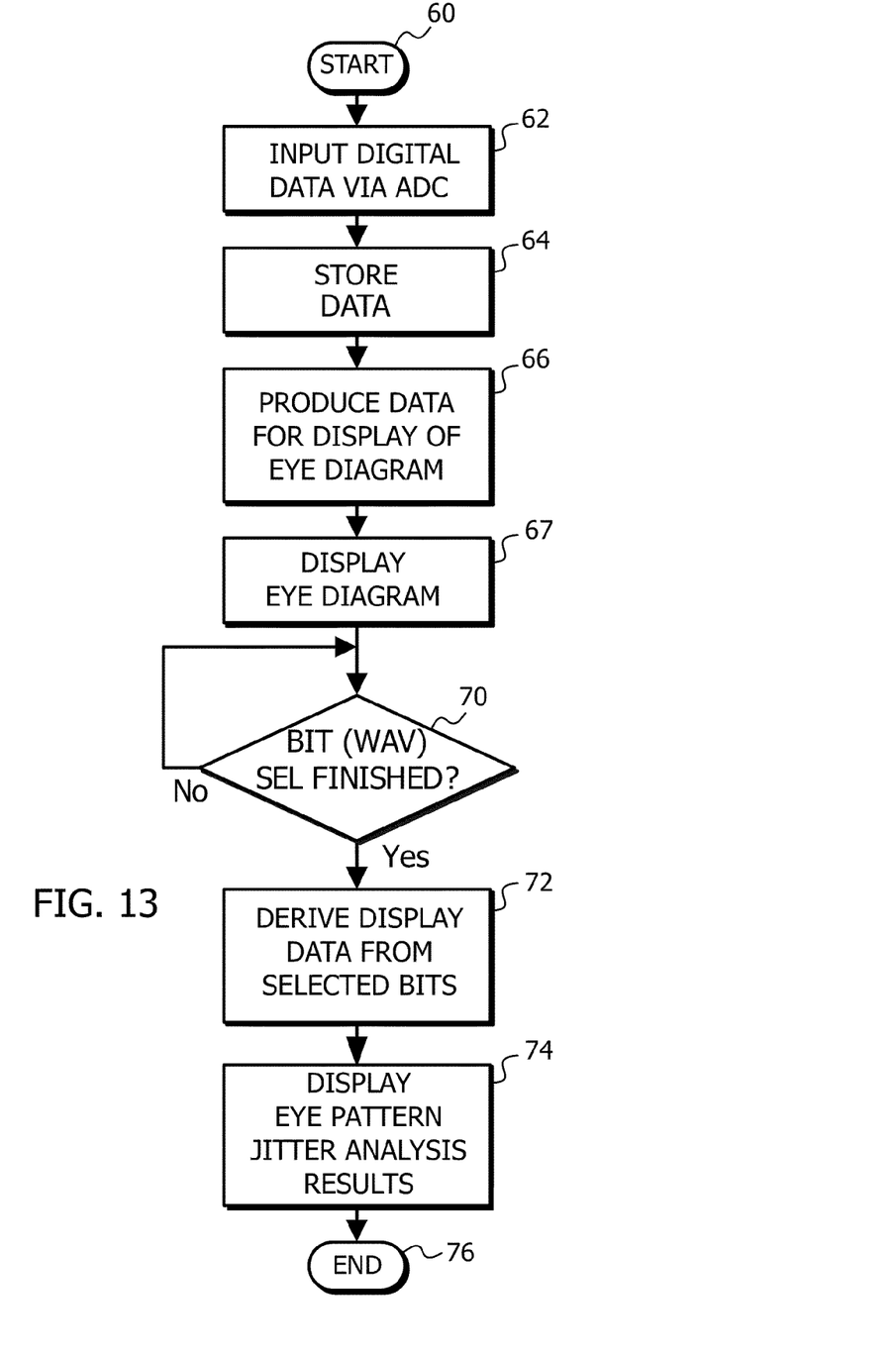
FIG. 13 is another example of a flow chart showing process flow of bit selection and display according to the present invention.

FIG. 13 is a flow chart showing a display process flow based upon another embodiment of the present invention. It is a flow chart of a process in which a user selects bits by selecting waveforms displayed on the screen by use of mouse cursor 23 (wherein each waveform corresponds to a particular bit of a packet of the digital signal), or by using the bit selection by waveform selection. To simplify the explanation, steps in FIG. 13 corresponding to ones in FIG. 12 have the same numbers and different steps are especially explained. In a step 67, data for an eye pattern display using all bits is produced similar to conventional methods based on pre-installed waveform data of the digital signal, and the eye diagram is displayed (step 68). The eye diagram is, however, different from conventional eye diagrams in that each of the waveforms constituting the eye diagram is presented in a different respective color or line pattern in order to distinguish between them for selection of one of the waveforms. The user selects ON with a waveform selection ON/OFF menu 27, which enables the Bit Selection by Waveform Selection function, and the user selects a displayed waveform with mouse cursor 23 to select a bit. Mouse cursor 23 changes its form from an arrow to a cross when it is moves into the eye diagram display area to more easily select the waveform. The user pushes the display button 21 with mouse cursor 23 after waveform selection (step 70) and the process advances to step 72. DSP 16 produces display data of an eye diagram or a graph of jitter analysis results based on only selected bits (step 72) to display the eye diagram or a graph of jitter analysis results (step 74).

The function of FIG. 13 is effective to observe waveforms derived using all bits, and then to select a waveform exhibiting a distortion, and then providing an eye diagram display or a graph of jitter analysis concerning the characteristics of only the selected waveform. In addition, the box objects shown in FIG. 6 can be applied to this function such that upon selection of a waveform, a black circle corresponding to the selected bit may be indicated. One skilled in the art will realize that text information identifying particular bits of particular packets of the selected waveform can be provided.

The present invention has been described as above based upon the preferred embodiments but the present invention can be modified variously without departing from the scope of the present invention. For example, if the waveform selection function is turned off, the waveforms constituting the eye pattern may be not discriminated and can be displayed as a histogram display as shown in FIG. 3. The bit selection means, described above as objects displayed on a display screen, is not so limited and can be realized in hardware, as a portion of an operation panel, for example. In the above examples, the Bit Selection mode of operation and the Bit Selection by Waveform Selection function are described independently from each other but one skilled in the art will recognize that they can be combined for bit selection.

In the above description and in the following claims the word "or" is used in the inclusive sense of "one" or "the other", or "both", but neither a choice between the two, nor a choice of "both" is required. Thus, recitation of "a display of an eye diagram or a graph" is intended to encompass a display of any of the following: a display of an eye diagram, a display of a graph, a display of an eye diagram and a display of a graph.

What is claimed is:

1. A method for performing digital signal analysis in a waveform display apparatus, comprising the steps of:
    acquiring data samples of a digital signal under test, said digital signal including a plurality of bits;
    executing a bit selection function for selecting at least one arbitrary bit of said plurality of bits of said digital signal;
    displaying a signal characteristic of only said selected arbitrary bits;
    wherein said signal characteristic is displayed as an eye diagram or as a graph of a jitter analysis result; and
    executing a function for displaying a first waveform derived from data of a first arbitrary bit and a second waveform derived from data of a second arbitrary bit, and displaying said first and second waveforms in said eye diagram or said graph such that they are visually distinguishable from one another.

2. The method of claim 1 wherein said bit selection function provides predetermined selectable bit patterns.

3. The method of claim 1 further including the steps of:
    executing a waveform selection function to make said displayed visually distinguished waveforms selectable;
    selecting one or more of said visually distinguished waveforms; and
    executing a function for displaying only said selected waveforms.

4. The method of claim 3 wherein said bit selection function provides predetermined selectable bit patterns.

5. The method of claim 1 wherein said bit selection function further comprises the step of:
    designating arbitrary sequential bits of the digital signal as selected or non-selected bits.

6. The method of claim 1 wherein said bit selection function further comprises the step of:
    designating any individual bit of said digital signal as a selected or a non-selected bit.

7. The method of claim 1 wherein said bit selection function further comprises the steps of:
    designating an arbitrary bit selection pattern;
    designating a shift bit number; and
    sequentially shifting said arbitrary bit selection pattern in accordance with said shift bit number.

8. The method of claim 1 wherein said bit selection function further comprises the steps of:
    designating an arbitrary bit pattern; and
    selecting bits of bit patterns of said digital signal corresponding to the designated arbitrary bit pattern.

9. A waveform display apparatus, comprising:
    acquisition circuitry including an analog to digital converter, said analog to digital converter acquiring data samples of a digital signal under test, said digital signal including a plurality of bits;
    a digital signal processor coupled to said acquisition circuitry for receiving said data samples, said digital signal processor analyzing said digital signal;
    a user operable input device coupled to said digital signal processor;
    said digital signal processor executing a bit selection function for selecting arbitrary bits of said plurality of bits of said digital signal, said arbitrary bits being selected by said user;
    said digital signal processor providing display data for display of an eye diagram or a graph of a jitter analysis result, said display data being derived from only said selected arbitrary bits of said digital signal; and
    a display screen, said display screen displaying said eye diagram or said graph of said jitter analysis result.

10. The waveform display apparatus of claim 9, wherein said waveform display apparatus is a test and measurement instrument;
    said test and measurement instrument being one of an oscilloscope, or a real time spectrum analyzer, or a logic analyzer.

11. The waveform display apparatus of claim 10, wherein said arbitrary bits are selected from a plurality of predetermined selectable bit patterns.

12. The waveform display apparatus of claim 10, wherein arbitrary sequential bits of said digital signal are designated as selected or non-selected bits in response to user input.

13. The waveform display apparatus of claim 10, wherein any individual bit of said digital signal is designated as a selected or a non-selected bit in response to user input.

14. The waveform display apparatus of claim 10, wherein said arbitrary bits are an arbitrary bit selection pattern designated in response to user input;
    a shift bit number is designated in response to user input; and
    said arbitrary bit selection pattern is shifted in accordance with said shift bit number.

15. The waveform display apparatus of claim 10, wherein said arbitrary bits are an arbitrary bit pattern designated in response to user input; and
    said digital signal is searched for an occurrence of a pattern corresponding to said designated arbitrary bit pattern, and only those arrangements of bits of said digital signal that correspond to said designated arbitrary bit pattern are selected.

16. A waveform display apparatus, comprising:
    acquisition circuitry including an analog to digital converter, said analog to digital converter acquiring data samples of a digital signal under test, said digital signal including a plurality of bits;
    a digital signal processor coupled to said acquisition circuitry for receiving said data samples, said digital signal processor analyzing said digital signal;
    a user operable input device coupled to said digital signal processor;
    said digital signal processor executing a bit selection function for selecting arbitrary bits of said plurality of bits of said digital signal, said arbitrary bits being selected by said user;
    said digital signal processor providing display data for display of an eye diagram or a graph of a jitter analysis result, said display data being derived from said plurality of bits of said digital signal; and
    a display screen, said display screen displaying said eye diagram or said graph of said jitter analysis result; wherein a plurality of waveforms displayed as said eye diagram or said graph of said jitter analysis result are displayed such that the individual waveforms of said plurality of waveforms substantially overlap one another when displayed on said display screen;

said plurality of waveforms including at least a first waveform, and a second waveform; and said first and second waveforms in said eye diagram or said graph being displayed such that said first and second waveforms are displayed in respective first and second colors.

17. The waveform display apparatus of claim 16, wherein said first and second waveforms displayed in said respective first and second colors are selectable by said user; and in response to a selection of one of said first and second waveforms displayed in said respective first and second colors, said digital signal processor derives data from only bits related to said selected waveform for display on said display screen.

\* \* \* \* \*